United States Patent
Vollrath

[19]

[11] Patent Number: 5,831,917
[45] Date of Patent: Nov. 3, 1998

[54] TECHNIQUES FOR REDUCING REDUNDANT ELEMENT FUSES IN A DYNAMIC RANDOM ACCESS MEMORY ARRAY

[76] Inventor: Joerg Vollrath, Koenigsbruckerstr. 73A, 01099 Dresden, Germany

[21] Appl. No.: 884,854

[22] Filed: Jun. 30, 1997

[51] Int. Cl.[6] .................................................. G11C 7/00
[52] U.S. Cl. ...................................... 365/200; 365/225.7
[58] Field of Search ................... 365/200, 225.7, 365/230.06, 230.03, 189.01

[56] References Cited

U.S. PATENT DOCUMENTS

5,528,539  6/1996  Ong et al. .............................. 365/200
5,689,463  11/1997  Murakami et al. ..................... 365/200

*Primary Examiner*—Vu A. Le
*Attorney, Agent, or Firm*—Stanton C. Braden

[57] ABSTRACT

A memory array having a first plurality of fuse-sharing redundant elements for replacing defective elements of the memory array. The memory array includes a first fuse, and first group of redundant elements of the first plurality of fuse-sharing redundant elements. The first group of redundant elements share the first fuse as their highest order address fuse. The memory array further includes a second group of redundant elements of the first plurality of fuse-sharing redundant elements. The second group of redundant elements is mutually exclusive with respect to the first group of redundant elements.

24 Claims, 10 Drawing Sheets

| $A_3$ | $A_2$ | $A_1$ | $A_0$ |
|---|---|---|---|
| 1 | 0 | 0 | 1 |
| 1 | 1 | 1 | 0 |
| 0 | 1 | 1 | 1 |
| 0 | 1 | 1 | 0 |
| 0 | 0 | 0 | 1 |

FIG. 13

TECHNIQUES FOR REDUCING REDUNDANT ELEMENT FUSES IN A DYNAMIC RANDOM ACCESS MEMORY ARRAY

BACKGROUND OF THE INVENTION

The present relates to the design and manufacture of semiconductor devices. More particularly, the present invention relates to improved techniques for increasing circuit density in a memory circuit.

In a memory circuit, e.g., a dynamic random access memory or a field programmable logic device, the memory cells are typically arranged in rows and columns for addressing purposes. By way of example, a typical dynamic random access memory (DRAM) chip may have up to 64 million cells or even more, which may be arranged in rows and columns to be addressed by word lines and bit lines. Dynamic random access memory circuits and designs therefor are well known in the art and will not be discussed in detail here for brevity's sake.

In a typical DRAM chip, one or more of the millions of cells in the main array may be found to be defective. Instead of discarding the entire chip, designers typically provide redundant cells, which may be substituted in for the defective cells. During use, the redundant cells are used in place of the replaced defective cells, thereby allowing the memory circuit to be used as if there were no defects.

If a cell in the main memory array is found to be defective during manufacturing, the entire row or column that contains the defective cell is usually replaced by a redundant row or column. For ease of reference, the entire row or column of cells is referred to herein as an element. Also for ease of understanding, the discussion herein will be made with reference to rows and the replacement thereof although it should be borne in mind that the issues discussed herein apply equally well to columns and their replacement.

When a redundant element is used to replace a defective element in the main array, the prior art technique of replacement involves setting an enable fuse of the redundant circuit during manufacturing to indicate that the redundant element is to be employed instead of one of the main array elements. The address of the defective main array element that is replaced by that redundant element is specified, during replacement time, by setting address fuses of that redundant element. In some DRAMs, the values of the enable fuse and address fuses may be loaded into an enable latch and address latches respectively. If the enable latch contains the value signifying that the redundant element should be used, that redundant element will be used in place of the defective main array element whose address is specified by the address latches.

Figure 1:
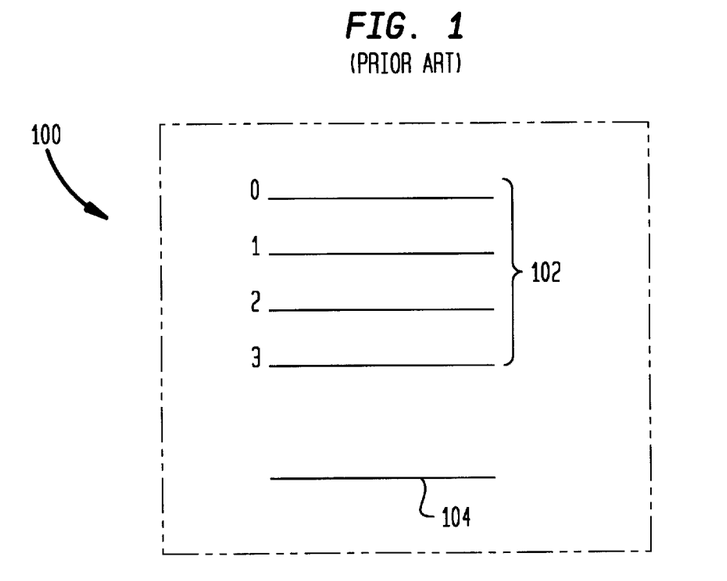
FIG. 1 illustrates a highly simplified DRAM cell having a main array to facilitate discussion.

To further elaborate, FIG. 1 illustrates a highly simplified DRAM chip 100 having a main array 102. Main array 102 is shown having only 4 rows or elements (0–3) to facilitate ease of discussion although a main array in reality typically has many more elements. There is also shown a redundant row or element 104, which may be used to replace any of elements 0–3. In an actual DRAM chip, there are typically significantly more rows of elements. Further, the main array may comprise a plurality of subarrays. However, the DRAM chip is shown with one main array having 4 rows of elements for simplicity of discussion.

Figure 2:
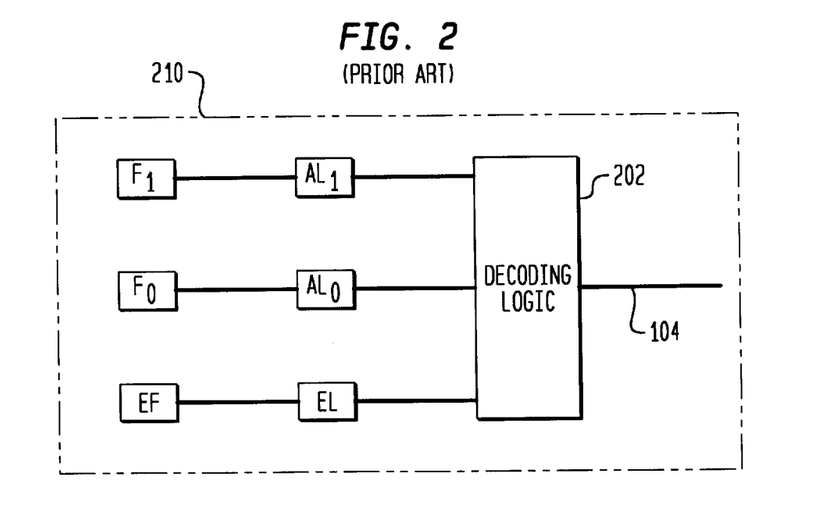
FIG. 2 illustrates the redundant circuitry employed in the prior art to specify the replacement address for a redundant element.

To replace any of elements 0–3, redundant element 104 is associated with two address bits A1 and A0. The values of the address bits specify to a decoding logic circuit which main array element of main array 102 redundant element 104 replaces. FIG. 2 illustrates the redundant circuitry employed in the prior art to specify the replacement address for redundant element 104. As shown in FIG. 2, redundant circuit 210 includes a redundant element 104, which is coupled to a decoding logic 202. Decoding logic 202 is responsible for ascertaining, based on the enable and address fuses set during manufacturing, whether redundant element 104 should be used to replace a defective main array element and if so, which defective main array element.

In FIG. 2, the enable fuse is shown as enable fuse EF, and the two address fuses for the example of FIG. 1 are shown as address fuses F1 and F0. Assume for the sake of discussion that main array element #2 was found to be defective during quality control of DRAM cell 100. In this case, enable fuse EF would be set to indicate that redundant array element 104 should be substituted in. Address fuse F1 would be set while address fuse F0 is not set to form the bit pattern "10" for specifying that redundant element 104 would be used to replace main array element 2.

During power up, i.e., during run time of the DRAM chip, the value in enable fuse EF is loaded into enable latch EL of FIG. 2. In this case, the value "1" would be loaded into enable latch EL. The values in address fuses F1 and F0 are also loaded into address latches AL1 and AL0 respectively, causing, for example, address latch AL1 to store the value "1" and address latch AL0 to store the value "0." Latches are employed since they can be read faster than fuses during run time, thereby optimizing the operating speed of the DRAM cell. By examining enable latch EL, decoding logic 202 can ascertain that redundant element 104 should be used to replace a defective array element. By examining address latches AL1 and AL0, decoding logic 202 can ascertain that redundant element 104 is to be used to replace defective array element #2.

While the prior art technique described in connection with FIG. 2 works adequately to replace defective main array elements, there are disadvantages. By way of example, as DRAM chips increase in capacity, there exists a need to put a greater number of main array memory elements and/or redundant elements into a chip of a given size. However, each fuse takes up a nontrivial area on the DRAM chip, and the large number of fuses required by the prior art approach disadvantageously requires a larger die size to accommodate all the fuses.

To illustrate, if the array has $2^n$ elements, n address fuses are required for each redundant element. Each redundant element also requires an enable fuse to indicate whether that redundant element should be used during run time, as discussed earlier. Accordingly, the total number of fuses required in the prior art for each redundant element is n+1. If m redundant elements are provided per array (to potentially replace m defective elements in the main array), the total number of fuses required is m*(n+1). As can be appreciated by those skilled in the art, if the total number of fuses can be reduced, it would be possible to reduce the die size, reduce the size of the resultant DRAM chip, and/or increase DRAM density.

In view of the foregoing, there are desired improved techniques for providing redundant elements for a DRAM array that advantageously reduce the area required for their implementation, thereby permitting a greater number of main array elements and/or redundant elements to be placed on a given chip.

SUMMARY OF THE INVENTION

The present invention, in one embodiment, to a method for reducing address fuses employed for implementing a first plurality of redundant elements in a memory array. The method includes ascertaining whether a number of redundant elements in the first plurality of redundant elements is at least three. If the number of redundant elements in the first plurality of redundant elements is at least three, the method includes optimizing the address fuses by forming a first group of redundant elements from the first plurality of redundant elements. The optimizing step further includes forming a second group of redundant elements from the first plurality of redundant elements. The second group of redundant elements is mutually exclusive with respect to the first group of redundant elements. The optimizing step also includes providing a first fuse to be shared among redundant elements of the first group of redundant elements. The first fuse implements a highest order address fuse of the redundant elements of the first group of redundant elements.

In another embodiment, the invention relates to a memory array having a first plurality of fuse-sharing redundant elements for replacing defective elements of the memory array. The memory array includes a first fuse, and first group of redundant elements of the first plurality of fuse-sharing redundant elements. The first group of redundant elements share the first fuse as their highest order address fuse. The memory array further includes a second group of redundant elements of the first plurality of fuse-sharing redundant elements. The second group of redundant elements is mutually exclusive with respect to the first group of redundant elements.

In yet another embodiment, the invention relates, in one embodiment, to a computer-implemented method for replacing a first plurality of defective elements of a memory array with redundant elements of a first plurality of fuse-sharing redundant elements. The computer-implemented method includes ascertaining whether a number of defective elements of the first plurality of defective elements is less than a number of redundant elements of the first plurality of fuse-sharing redundant elements. If the number of defective elements of the first plurality of defective elements is less than the number of redundant elements of the first plurality of fuse-sharing redundant elements, the computer-implemented method further includes adding a plurality of dummy defective elements to the first plurality of defective elements to increase a number of defective elements of the first plurality of defective elements to the number of redundant elements of the first plurality of fuse-sharing redundant elements.

The computer-implemented method also includes ascertaining whether the number of defective elements of the first plurality of defective elements is at least three. If the number of defective elements of the first plurality of defective elements is at least three, the computer-implemented method includes replacing respective ones of the first plurality of defective elements by respective ones of the first plurality of redundant elements by performing the step of forming a first group of defective elements from the first plurality of defective elements. Defective elements in the first group of defective elements share a same bit value at a highest order address bit position. The replacing step further includes the step of forming a second group of defective elements from the first plurality of defective elements. The second group of defective elements are mutually exclusive with respect to the first group of defective elements. The replacing step also includes the step of assigning respective ones of the first group of defective elements to respective ones of the first group of redundant elements for replacement.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

To facilitate discussion of the possibility of fuse sharing.

DETAILED DESCRIPTION OF THE INVENTION

The present invention will now be described in detail with reference to a few illustrative embodiments as provided in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Generally speaking, the inventive fuse saving technique may be employed both during fabrication of the memory integrated circuits (ICs) such as random access memories (RAMs) including DRAMs and synchronous DRAMs (SDRAMs) and during replacement of the defective main array elements. Other ICs include logic chips such as field programmable gate arrays (FPGAs) or other logic chips During DRAM fabrication, the fuse saving technique may be employed to decide how to share fuses among the redundant elements provided. This is because the number of redundant elements are typically variable among different types of DRAM circuits. By way of example, DRAM circuits fabricated using different technologies and/or design rules may have different defect rates. Accordingly, DRAM circuits may be provided with different numbers of redundant elements even though they may, for example, have the same capacity. For ease of reference, in the situation wherein the inventive fuse saving technique is applied during fabrication, it is referred to herein as fabrication-time application.

After the DRAM circuit is fabricated, the fuse saving technique may be applied again to determine how to assign the defective elements to the redundant elements for replacement. The defective elements are typically found after fabrication, e.g., during quality control testing of the fabricated DRAM circuit. Since the number of fuses in the provided redundant elements have already optimized by the fabrication-time application of the inventive fuse saving technique, it is important to correctly assign defective elements whose fuses can be shared to the proper group of fuse-sharing redundant elements. The replacement-time application of the fuse saving technique to the defective elements advantageously ensures that the unique address of each defective element is uniquely represented by one of the redundant elements even though some of them share fuses.

Figure 3:
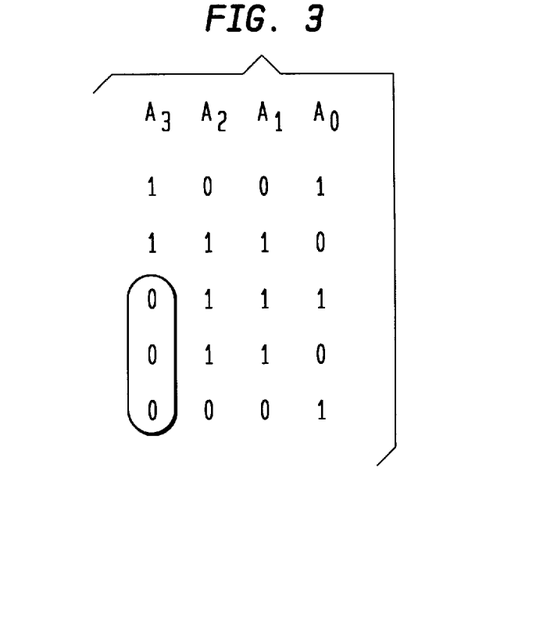
FIG. 3 illustrates the five exemplary defective elements and their addresses.

To further elaborate, it is advantageously recognized that beyond a certain size, defective elements begin to share their higher order bit(s), i.e., the more significant bits. To illustrate this fact, consider a hypothetical DRAM array wherein there are only 16 main array elements. To uniquely address the 16 main array elements, four address bits are required (A3, A2, A1, and A0). Assume that 5 of the 16 main array elements are found to be defective during replacement time. FIG. 3 illustrates the five defective elements and their addresses. Note that the three defective elements 0001, 0110, and 0111 share the highest order bit A3 (whose value is "0" in this case). Accordingly, it is recognized that savings in fuse areas can be advantageously realized if some of the redundant elements can be grouped during fabrication such that some of the higher order bit(s) can be represented by shared fuses. Most importantly, the sharing of fuses must be done in a manner so as a maximum number of fuses can be saved without any adverse impact on the flexibility with which defective elements can be replaced during replacement time, i.e., without giving rise to the unacceptable situation wherein a defective element cannot be replaced because its address can not be represented by one of the fuse-sharing redundant elements.

Figure 4A:
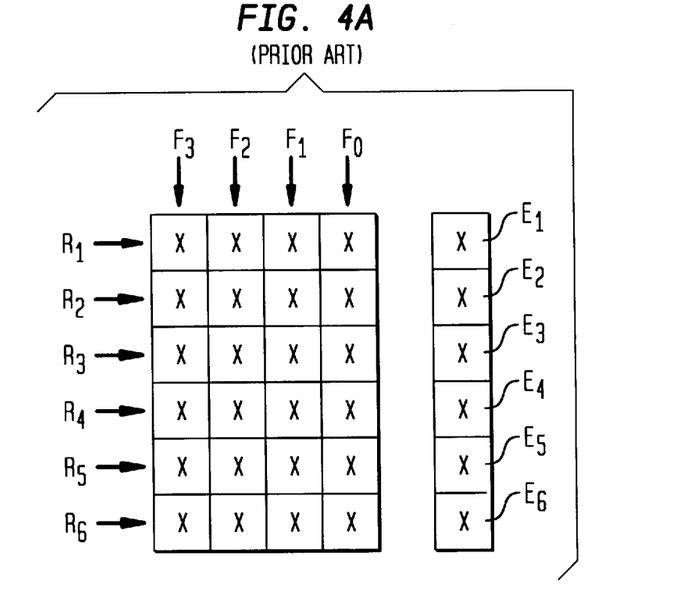
FIG. 4A illustrates the fuses that would be provided in the prior art with six redundant elements, each having four address fuses.
Figure 4B:
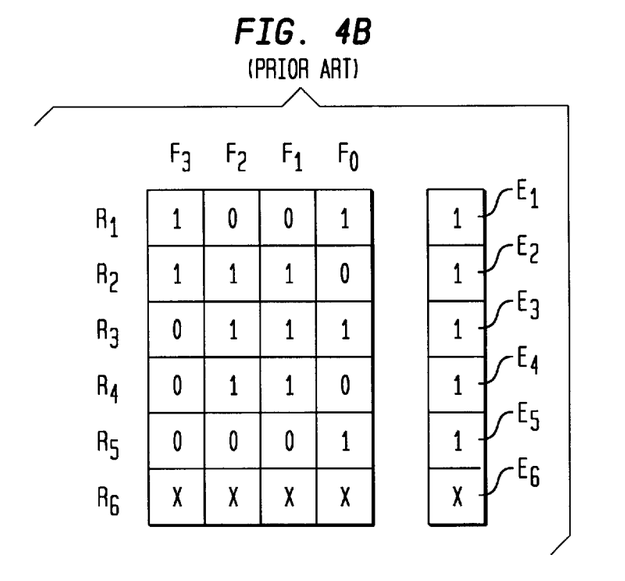
FIG. 4B illustrates how the fuses of FIG. 4A may be set during replacement time to facilitate the replacement of the defective elements of the example of FIG. 3.

To contrast the prior art approach with that of one embodiment of the present invention, assume that six redundant elements are provided to potentially replace a total of six defective elements of a DRAM array that has a total of sixteen main array elements. FIG. 4A illustrates the six provided redundant elements, along with the fuses that are typically provided in accordance with prior art techniques. Note that in this case, there are a total of 6×4 or 24 address fuses (since four address fuses are needed to uniquely address any one of the 16 main array elements). The six enable fuses are also shown as enable fuses E1–E6, for a total of 30 fuses. Prior art FIG. 4B illustrates how the fuses of prior art FIG. 4A may be set during replacement time to facilitate the replacement of the defective elements of the example of FIG. 3 (i.e., those having addresses 0001, 0110, 0111, 1001 and 1110). The set enable fuses are also shown for completeness. Fuses that are not set are represented by the symbol "X."

Figure 5:
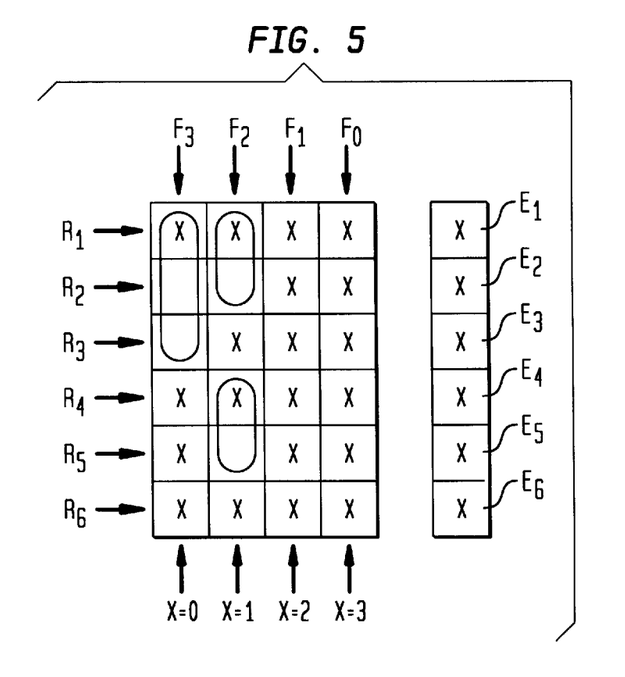
FIG. 5 illustrates, in accordance with one embodiment of the present invention, the six fuse-sharing redundant elements, along with the fuses that are shared among neighboring redundant elements to save fuses.

FIG. 5 illustrates, in accordance with one embodiment of the present invention, the six redundant elements, along with the fuses that are shared among neighboring redundant elements to save fuses. During fabrication time, the redundant elements are grouped such that redundant elements R1–R3 share the highest order fuse F3 (depicted by the fact that fuses F3 of redundant elements R1, R2, and R3 are circled together). Redundant elements R1–R2 also share the next highest order fuses F2. Redundant elements R4–R6, as a separate group, also share the next highest order fuses F2.

Accordingly, two F3 fuses are saved (since only one F3 fuse is needed for sharing among redundant elements R1, R2, and R3). Further, two F2 fuses are also saved (one each from the groups R1/R2 and R4/R5) for a total saving of four fuses. The inventive algorithm for sharing fuses among groups of redundant elements are discussed later herein in connection with FIG. 8.

Figure 6:
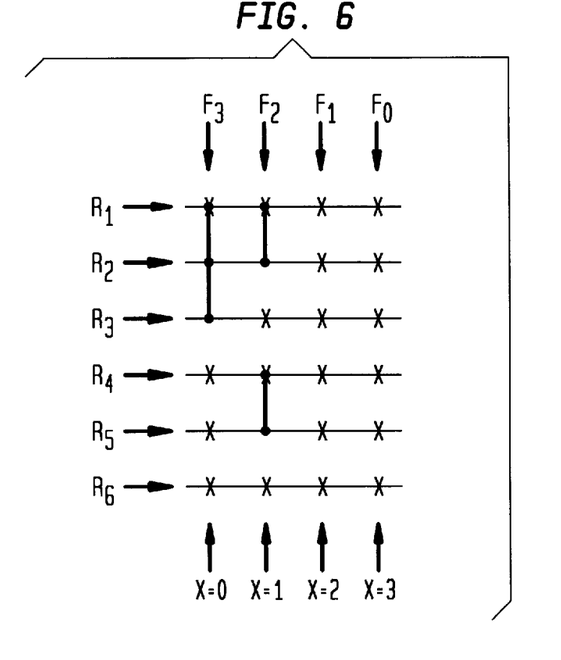
FIG. 6 is a simplified circuit diagram of the redundant elements of FIG. 5.

FIG. 6 is a simplified circuit diagram of the redundant elements of FIG. 5 wherein one fuse F3 is shared among redundant elements R1, R2, and R3. One fuse F2 is shared by redundant elements R1 and R2. Another fuse F2 is shared by redundant elements R4 and R5.

Figure 7:
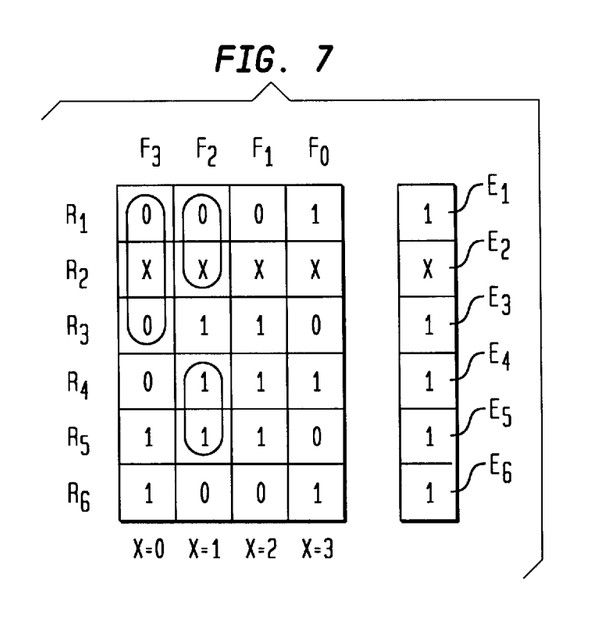
FIG. 7 illustrates how the fuses of the redundant elements of FIG. 5 may be set during replacement time to facilitate the replacement of the defective array elements of the previous example of FIG. 3

FIG. 7 illustrates how the fuses of the redundant elements of FIG. 5 may be set during replacement time to facilitate the replacement of the defective array elements of the previous example of FIG. 3 (i.e., those having addresses 0001, 0110, 0111, 1001 and 1110). Since the redundant element(s) whose enable fuse(s) are not set are not employed during run time, the fact that some of the shared fuses coupled to redundant element R2 are set (fuse F2 is set to 0, for example) does not give rise to error. Redundant element R2 is simply not used during run time to replace one of the main array elements. The fuses of redundant elements R1, R3, R4, R5, and R6, including the shared fuses, fully represent the respective addresses of the defective elements of the example of FIG. 3 (i.e., those having addresses 0001, 0110, 0111, 1110 and 1001). The application of the replacement technique for this example is discussed more fully in connection with FIGS. 10 and 11 herein.

To further illustrate the flexibility of the present approach, consider the situation wherein only three defective elements 0001, 0101, and 1111 are found during quality control testing. In this case, these three defective elements can be replaced by respective redundant elements R1, R3, and R4 of FIG. 5. The application of the replacement technique for this example is discussed more fully in connection with FIGS. 10 and 12 herein.

As an additional example, consider the situation wherein defective elements 0000, 0001, 0010, 0011, 0100, and 1101 are found defective during replacement. In this case, the six defective elements can be replaced by respective redundant elements R1, R2, R3, R6, R4, and R5. The application of the replacement technique for this example is discussed more fully in connection with FIGS. 10 and 13 herein.

Figure 8:
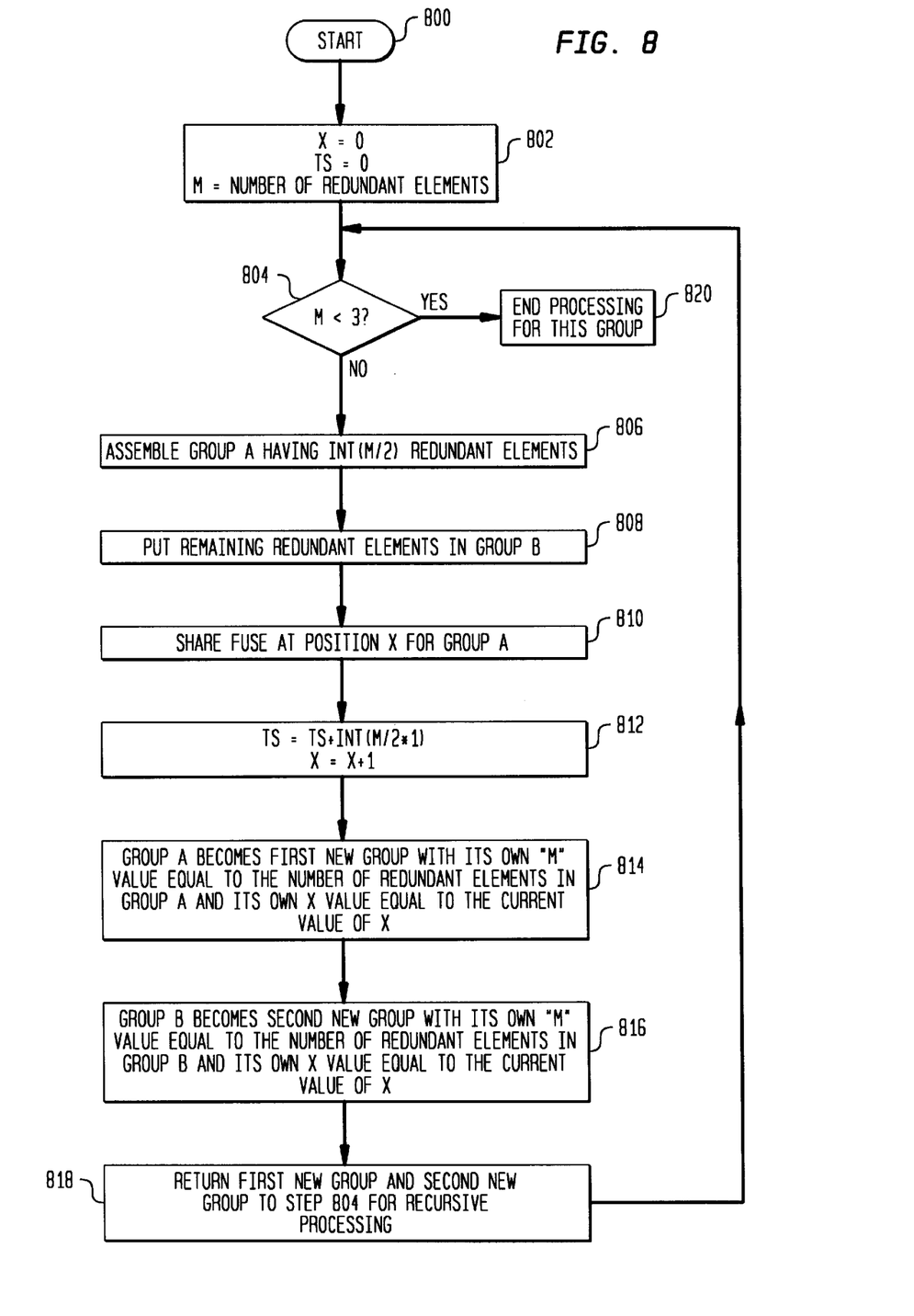
FIG. 8 illustrates, in accordance with one aspect of the present invention, the method employed during fabrication time for grouping redundant elements for the purpose of sharing fuses.

FIG. 8 illustrates, in accordance with one aspect of the present invention, the general method employed during fabrication time for grouping redundant elements of any arbitrary group of redundant elements for the purpose of sharing fuses. The method starts in step 802 by initializing the bit position counter value X to be 0, the number of total saved fused (TS) to be 0, and set M to be the number of redundant elements provided.

In the first iteration, the entire group of all the redundant elements provided is processed. As will be shown later, this group will be iteratively divided and processed until the group is smaller than 3. Following step 802, the method determines in step 804 whether there are at least 3 redundant elements in this group. If there are fewer than 3, no additional saving in fuses could be done by grouping redundant elements and combining fuse elements of adjacent redundant elements without loss of replacement flexibility. If the group has fewer than 3 redundant elements, processing for this group ends in step 820.

On the other hand, if there are 3 or more redundant elements, the method begins by dividing the group of M redundant elements into two groups: A and B. In step 806, INT (M/2) redundant elements are grouped together as group A (where the operator INT rounds up the value of M/2 to the next higher integer if M/2 is not already an integer). With reference to the example of FIG. 4A, there are six redundant elements (i.e., M=6). Accordingly, group A would consist of 3 redundant elements R1, R2, and R3.

Figure 9:
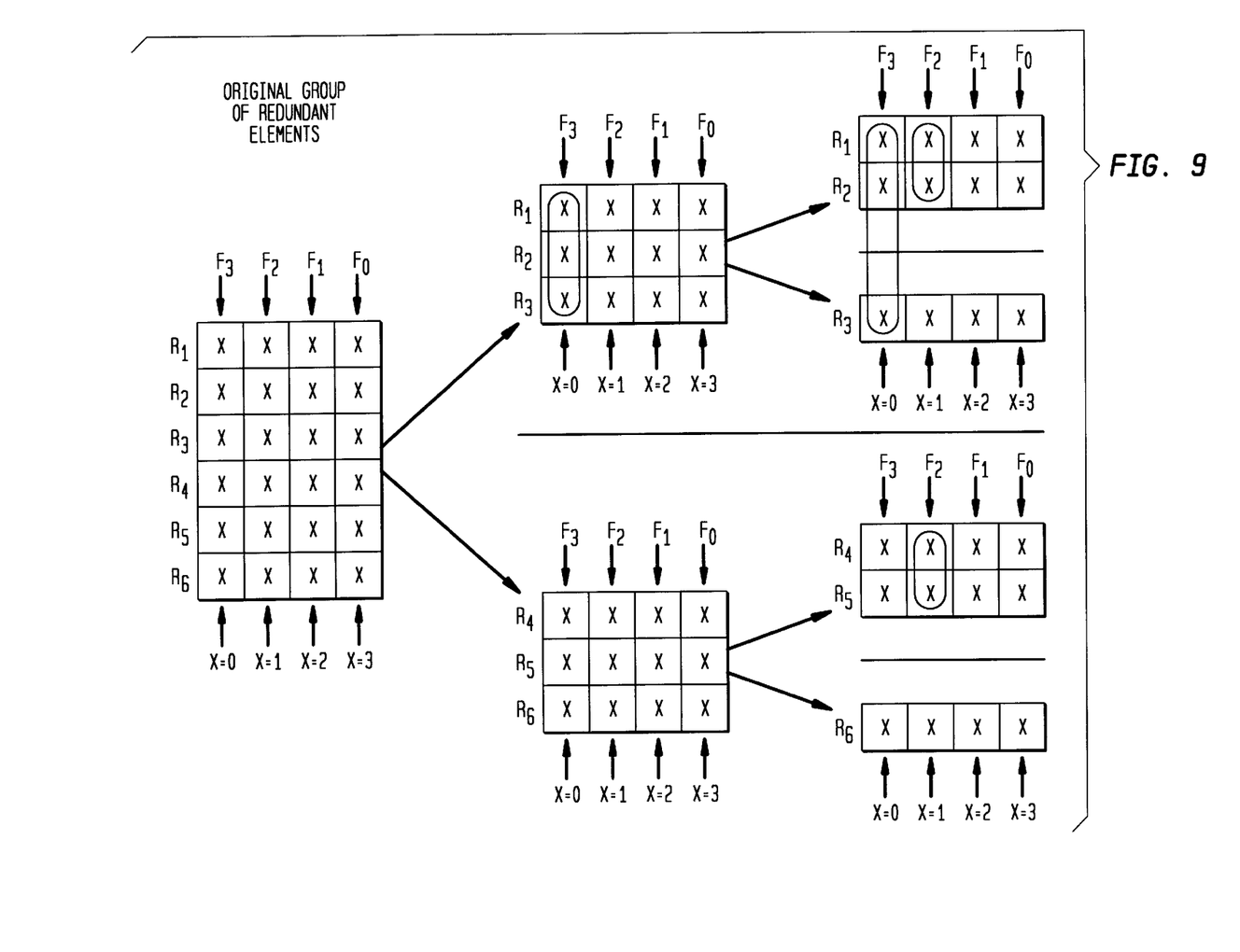
FIG. 9 illustrates the application of the method of FIG. 8 to optimize the fuses provided with prior art FIG. 4A.

In step 808, the remaining redundant elements (i.e., M−INT (M/2)) are grouped together as group B. With reference to the example of FIG. 4A, group B would consist of 3 redundant elements R4, R5, and R6. Groups A and B are shown in FIG. 9 under the column heading "First Iteration."

In step 810, the fuses at bit position X (currently X=0) are shared among the redundant elements in group A. Accordingly, fuses F3 (bit position X=0) are shared among redundant elements R1, R2, and R3 in FIG. 5. This sharing is also depicted in FIG. 9 by the fact that fuse F3 of redundant elements R1, R2, and R3 are grouped together. In step 812, bit position counter value X is incremented by 1. The total fuse savings (TS) after this first iteration is represented by the equation $$TS=TS+INT\ (M/2-1) \qquad (Eq.\ 1)$$

wherein TS represents the total number of saved fuses up to now, M represents the number of redundant elements in this iteration, and the operator INT rounds up the value of (M/2−1) to the next higher integer if (M/2−1) is not already an integer. Since M equals to 6 in this iteration, TS now has the value 0+INT (6/2−1) or 2.

Thereafter, the method is performed recursively starting from step 804 using group A as the new first group of redundant elements, i.e., group A is now processed by itself as a separate execution thread. To facilitate the recursive operation, the new M value for group A is set to be equal to the number of redundant elements currently in the group A (step 814) and its own X value that is equal to the current X value. Since group A currently has three redundant elements (R1, R2, and R3), M=3 for the first group. The bit counter value X for this first group is 1 going into the second iteration.

The method is also performed recursively for group B as a separate group of redundant elements. This second group B will have its own value M set to be equal to the number of redundant elements in group B (step 816) and its own X value that is equal to the current X value. Since group B currently has three redundant elements (R4, R5, and R6), M=3 for this second group. The bit counter value X for this second group is 1 going into the second iteration.

Thereafter, both the first group and the second group of redundant elements, with their respective M values, and the new bit counter position values X are returned to step 804 for recursive operation (step 818). FIG. 9 illustrates, under the heading "First Iteration," the result at the end of the first iteration in which two groups (comprising R1/R2/R3 and R4/R5/R6 respectively) are input into the second iteration. These two groups are processed as two separate execution threads, i.e., two new separate processes.

In the second iteration, either the first group or the second group may be processed first. If the first group (the old group A comprising three redundant elements R1/R2/R3) is processed first, its M value is 3, which is not less than 3 (step 804). Accordingly, the method proceeds to step 806 to assemble the new group A and the new group B out of this first group (which has redundant elements R1, R2 and R3). The new group A will have, as mentioned earlier, INT (M/2) redundant elements. Accordingly, the new group A will have 2 redundant elements R1 and R2. The new group B will have the remaining redundant element R3. This situation is shown in FIG. 9 under the column heading "Second Iteration."

In step 810, the fuses at position X will be shared for the new group A. Since X is 1, fuse F2 for redundant elements R1 and R2 will be shared. In step 812, the bit counter value X is updated to be 3. The total number of fuses saved (TS) after this iteration is completed is TS+INT (M/2−1) or 2+INT (3/2−1) or 2+1 or 3. The result at the end of the second iteration for the group comprising redundant elements R1 and R2 is shown in FIG. 9 under the heading "Second Iteration."

According to steps 814, 816, and 818, these two new groups (comprising R1/R2 and R3 respectively) will be recursively processed. However, since neither of these two groups passes the test of step 804 at the start of the third iteration (i.e., neither has at least 3 redundant elements), the processing for these two new groups ends at step 820 (i.e., there is no third iteration).

The second group of the second iteration (comprising three redundant elements R4, R5, and R6) are similarly processed in the second iteration as a separate execution thread. The processing of this second group having three redundant elements R4/R5/R6 also yields an additional fuse saving when this second group is split into two groups and redundant elements R4 and R5 share fuse F2 (see FIG. 9). The total number of fuses saved (TS) after this iteration is completed is TS+INT (M/2−1) or 3+INT (3/2−1) or 3+1 or 4.

According to steps 814, 816, and 818, the two new groups split from the group comprising three redundant elements R4/R5/R6 will be recursively processed. With reference to the example of FIG. 9, these two new groups comprise, respectively, redundant elements R4/R5 and R6. However, since neither of these two groups passes the test of step 804 at the start of the third iteration (i.e., neither has at least 3 redundant elements), the processing for these two new groups ends at step 820.

As can be seen in FIGS. 5 and 9, the application of the method of FIG. 8 yields four saved fuses (two F3 and two F2), which is the value represented by TS at the end of the second iteration. The application of the general method of FIG. 8 to any group of redundant elements having any number of arbitrary redundant elements is left to the reader to perform as an exercise.

Once the DRAM IC is fabricated with the fuses shared among redundant elements, the DRAM IC may be tested to determine how many and which ones of the main array elements are defective. The defective array elements are then replaced by the fuse-sharing redundant elements. The invention provides, in accordance with another aspect of the invention, a method for assigning the defective elements to the fuse-sharing redundant elements. Since some of the redundant elements now share fuses, it is important to assign groups of defective elements to the correct groups of redundant elements so that there would be no loss of replacement flexibility, i.e., there would be no risk that one or more defective elements cannot be replaced.

Figure 10:
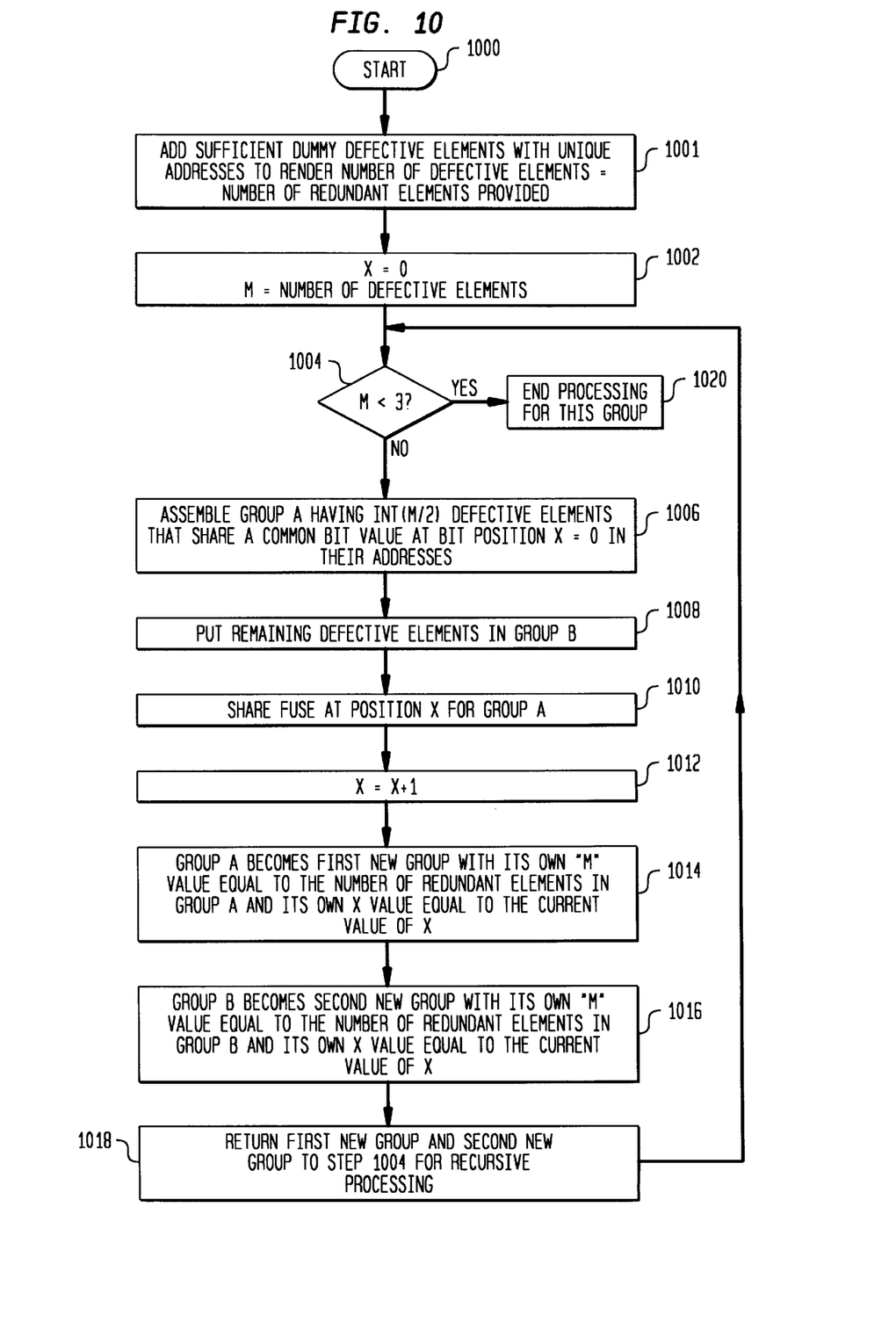
FIG. 10 illustrates, in accordance with one aspect of the present invention, the method employed during replacement time for grouping the defective elements for the purpose of subsequently assigning each defective element to the proper redundant element of the fuse-sharing redundant elements.

FIG. 10 illustrates, in accordance with one aspect of the present invention, the method employed during replacement time for grouping the defective elements for the purpose of subsequently assigning each defective element to the proper redundant element of the fuse-sharing redundant elements. The method starts in step 1001 by adding a sufficient number of dummy defective elements with unique addresses (i.e., non-repeating addresses that are different from the addresses of the real defective elements) so that the total number of defective elements (real and dummy) equals the number of provided redundant elements. Typically, the dummy defective elements are flagged so that after they are assigned to redundant elements, the enable fuses associated with those redundant elements are not set (since these defective elements are dummy and are added for assignment only, not for true replacement in use). As will be illustrated herein, the adding of the dummy elements, in a nonobvious and novel manner, allows correct assignment to be made irrespective of how many defective elements (up to the total number of redundant elements provided) are found during manufacturing.

In step 1002 the bit position counter value X is initialized to be 0 and the value M is set to be the number of defective elements found. Prior to step 1002, the redundant elements may be sorted by their addresses if desired (e.g., in ascending order).

In the first iteration, the entire group of all the defective elements found is processed. As will be shown later, this group will be iteratively divided and processed until the group is smaller than 3. Following, step 1002, the method determines in step 1004 whether there are at least 3 defective elements in this group. If the group has fewer than 3 defective elements, processing for this group ends in step 1020, and assignment may be begin immediately. Assignment after processing is discussed later herein.

Figure 11:
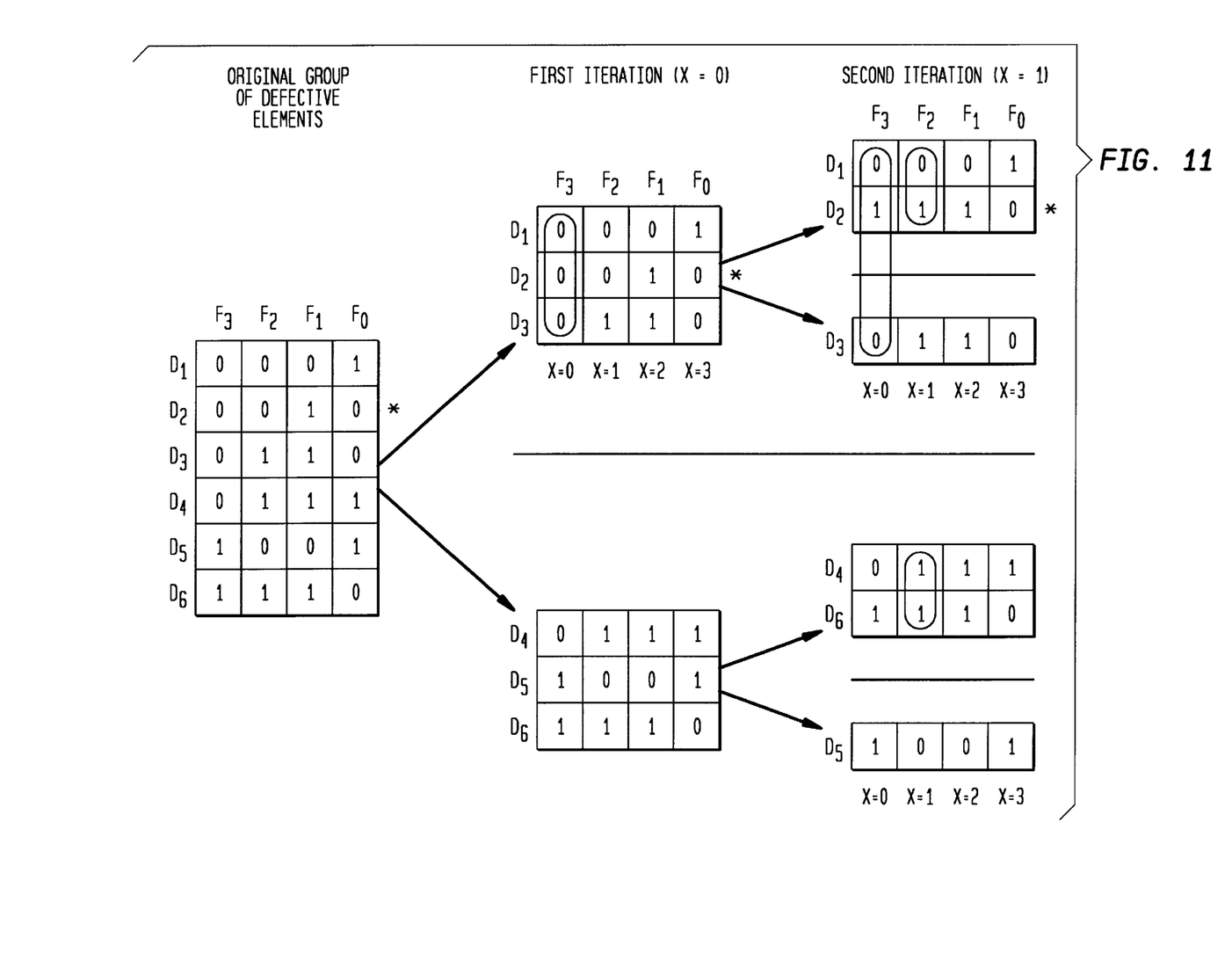
FIG. 11 illustrates the application of the method of FIG. 10 to the example of FIG. 3.

On the other hand, if there are 3 or more defective elements, the method begins by dividing the group of M defective elements into two groups: A and B. In step 1006, INT (M/2) defective elements that share a common bit value (either 0 or 1) at bit position X are grouped together as group A (where the operator INT rounds up the value of M/2 to the next higher integer if M/2 is not already an integer). With reference to the example of FIG. 3, there are five defective elements (i.e., M=5). Accordingly, a dummy defective element having a unique address will be added to make the total number of defective elements (real and dummy) equal to the number of redundant elements provided. As shown in FIG. 11, the dummy element is shown as dummy element D2 (whose address is 0010). This dummy element is flagged (depicted by the asterisk in FIG. 11) to ensure that after it is assigned to a redundant element, the enable fuse associated with that redundant will not be set. In the embodiment of FIG. 11, the original group of defective elements is also sorted in ascending order after the dummy defective element is added.

Group A would consist of 3 defective elements D1, D2, and D3. This grouping is shown in FIG. 11 under the column heading "First Iteration." This grouping is correct since fuse F3 of defective elements D1, D2, and D3 all have the same bit value "0".

In step 1008, the remaining defective elements (i.e., M−INT (M/2)) are grouped together as group B. With reference to the example of FIG. 3, group B would consist of 3 remaining defective elements D4, D5 and D6. This grouping is also shown in FIG. 1 under the column heading "First Iteration."

In step 1010, the fuses at bit position X (currently X=0) are shared among the defective elements in group A. Accordingly, fuses F3 (bit position X=0) are shared among defective elements D1, D2, and D3 in FIG. 11. In step 1012, bit position counter value X is incremented by 1.

Thereafter, the method is performed recursively starting from step 1004 using group A as the new first group of defective elements, i.e., group A is now processed by itself as a separate execution thread. To facilitate the recursive operation, the new M value for group A is set to be equal to the number of defective elements currently in the group A (step 1014) and its own X value that is equal to the current X value. Since group A currently has three defective elements (D1, D2, and D3), M=3 for this first group, and the bit counter value X for this first group is 1 going into the second iteration.

The method is also performed recursively for group B as a separate group of defective elements. This second group B will have its own value M set to be equal to the number of defective elements in group B (step 1016) and its own X value that is equal to the current X value. Since group B currently has three defective elements (D4, D5, and D6), M=3 for this second group, and the bit counter value X for this second group is 1 going into the second iteration.

Thereafter, both the first group and the second group of defective elements, with their respective M values and the new bit counter position values X are returned to step 1004 for recursive operation (step 1018). FIG. 11 illustrates, under the heading "First Iteration," the result at the end of the first iteration in which two groups (comprising D1/D2/D3 and D4/D5/D6 respectively) are input into the second iteration. These two groups are processed as two separate execution threads, i.e., two new separate processes.

In the second iteration, either the first group or the second group may be processed first. If the first group (the old group A comprising three defective elements D1/D2/D3) is processed first, its M value is 3, which is not less than 3 (step 1004). Accordingly, the method proceeds to step 1006 to assemble the new group A and the new group B out of this first group (which has defective elements D1, D2 and D3). The new group A will have, as mentioned earlier, INT (M/2) defective elements. Since defective elements D1 and D2 of the group comprising defective elements D1/D2/D3 share the same bit value "0" at the current bit counter position X (currently X=1), defective elements D1 and D2 are grouped together as the new group A. Accordingly, the new group A will have 2 defective elements D1 and D2. The new group B will have the remaining defective element D3. This situation is shown in FIG. 11 under the column heading "Second Iteration."

In step 1010, the fuses at position X will be shared for the new group A. Since X is now 1, fuse F2 for defective elements D1 and D2 will be shared. This is correct since both defective elements D1 and D2 share the common bit value "0" at bit position X=1. In step 1012, the bit counter value X is updated to be 3. The result at the end of the second iteration for the group comprising defective elements D1 and D2 is shown in FIG. 9 under the heading "Second Iteration."

According to steps 1014, 1016, and 1018, these two new groups (comprising D1/D2 and D3 respectively) will be recursively processed. However, since neither of these two groups passes the test of step 1004 at the start of the third iteration (i.e., neither has at least 3 defective elements), the processing for these two new groups ends at step 1020 (i.e., there is no third iteration).

The second group of the second iteration (comprising three defective elements D4, D5, and D6) are similarly passed on to the second iteration to be processed in the second iteration as a separate execution thread. Its M value is 3, which is not less than 3 (step 1004). Accordingly, the method proceeds to step 1006 to assemble the new group A and the new group B out of this second group (which has defective elements D4, D5 and D6). The new group A will have, as mentioned earlier, INT (M/2) defective elements. Since defective elements D4 and D6 of the group comprising defective elements D4/D5/D6 share the same bit value "1" at the current bit counter position X (currently X=1), defective elements D4 and D6 are grouped together as the new group A. Accordingly, the new group A will have 2 defective elements D4 and D6. The new group B will have the remaining defective element D5. This situation is shown in FIG. 11 under the column heading "Second Iteration."

In step 1010, the fuses at position X will be shared for the new group A. Since X is now 1, fuse F2 for defective elements D4 and D6 will be shared. This is correct since both defective elements D4 and D6 share the common bit value "1" at bit position X=1. In step 1012, the bit counter value X is updated to be 3. The result at the end of the second iteration for the group comprising defective elements D4 and D6 is shown in FIG. 9 under the heading "Second Iteration."

According to steps 1014, 1016, and 1018, these two new groups (comprising D4/D6 and D5 respectively) will be recursively processed. However, since neither of these two groups passes the test of step 1004 at the start of the third iteration (i.e., neither has at least 3 defective elements), the processing for these two new groups ends at step 1020 (i.e., there is no third iteration).

Figure 12:
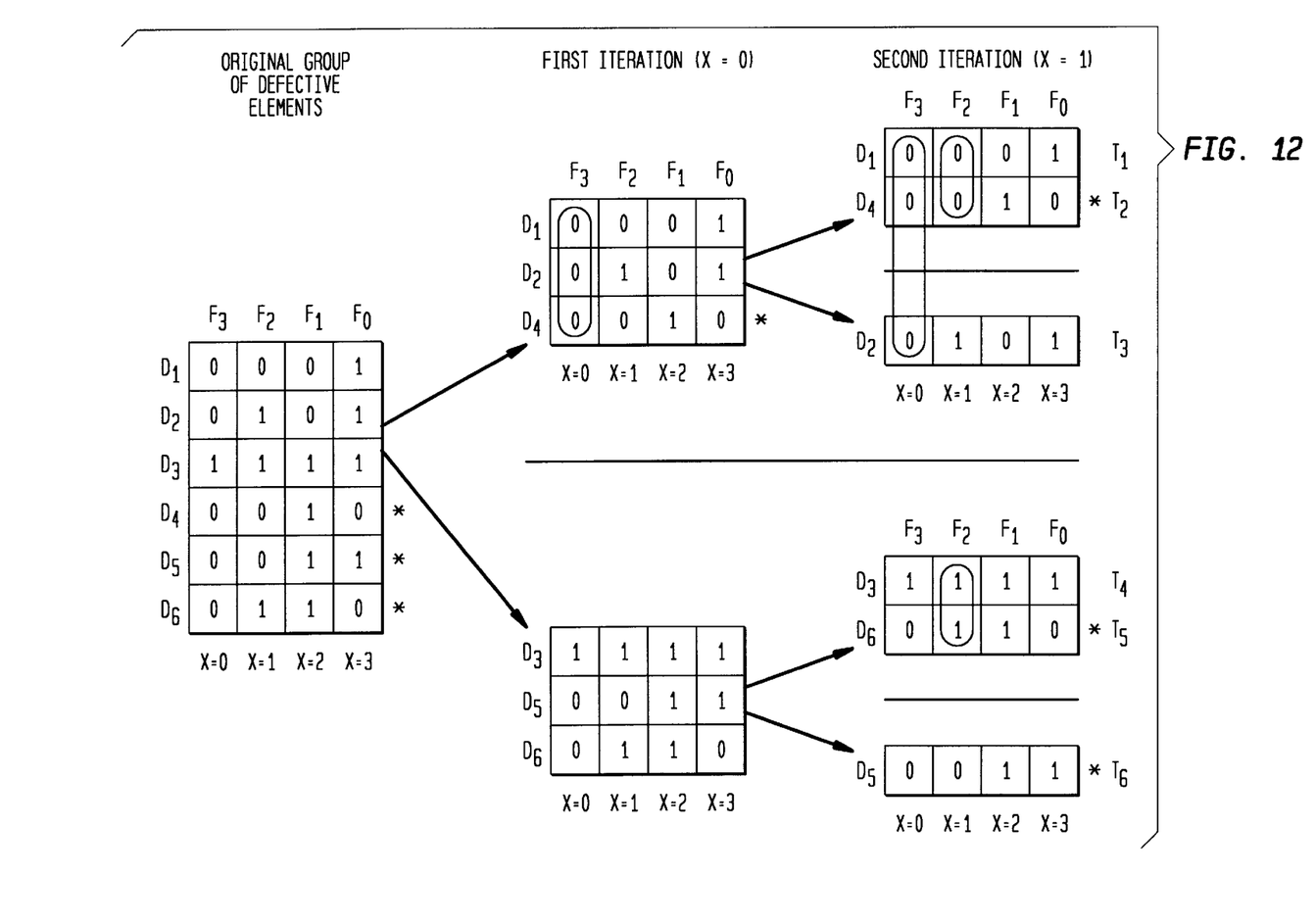
FIG. 12 illustrates the application of the method of FIG. 10 to a group of 3 defective elements whose addresses are 0001, 0101, and 1111.

FIG. 12 illustrates the application of the method of FIG. 10 to a group of 3 defective elements whose addresses are 0001, 0101, and 1111. To facilitate assignment, three dummy defective elements (addresses 0010, 0011, 0110) are added and flagged with asterisks as shown. In this example, the original group of defective elements are not sorted. The result of the application of the steps of FIG. 10 to these defective elements are also shown in FIG. 12.

Figure 13:
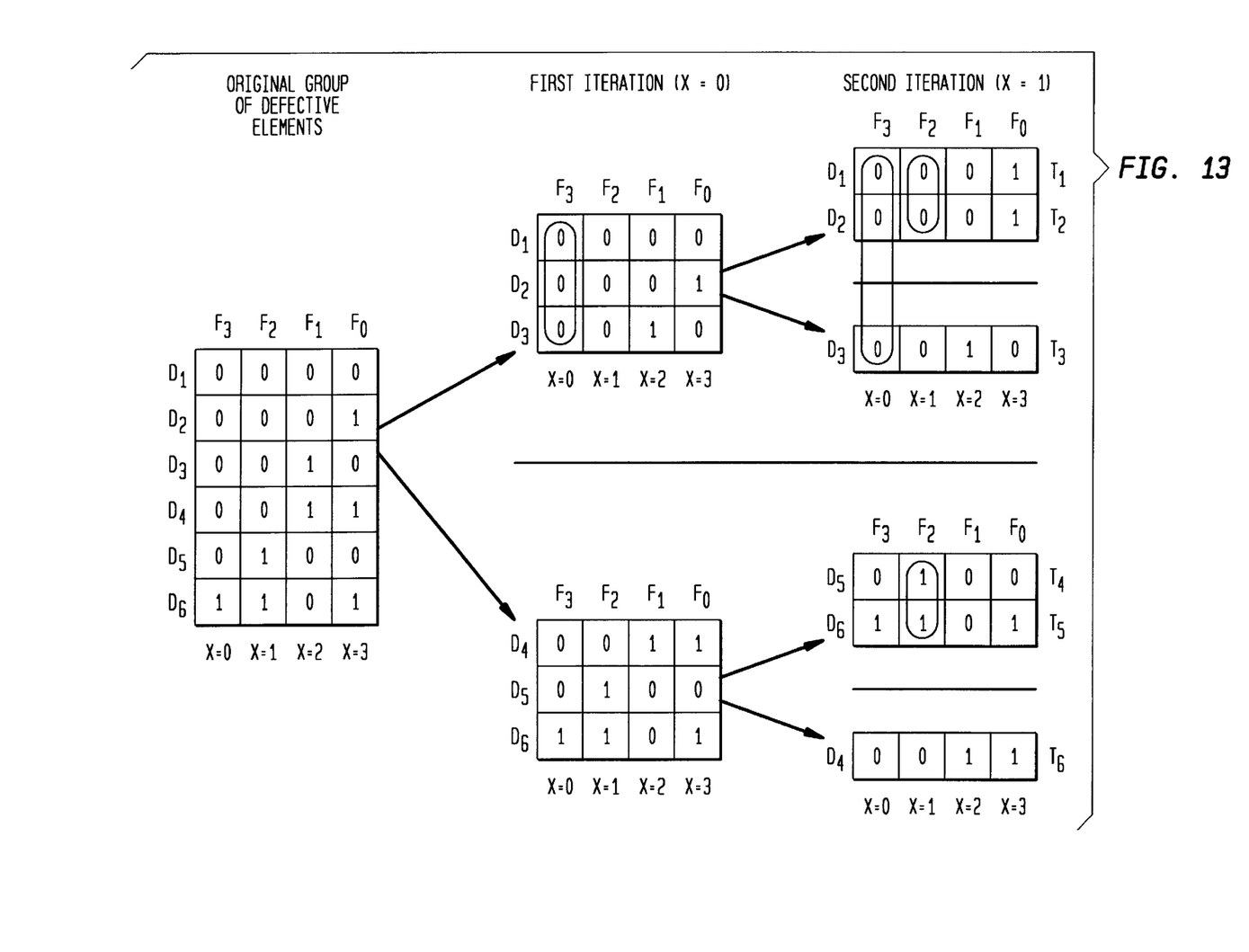
FIG. 13 illustrates the application of the method of FIG. 10 to a group of 6 defective elements whose addresses are 0000, 0001, 0010, 0011, 0100, and 1101.

FIG. 13 illustrates the application of the method of FIG. 10 to a group of 6 defective elements whose addresses are 0000, 0001, 0010, 0011, 0100, and 1101. Since there are already 6 real defective elements, no dummy elements are required to make the total number of defective elements equal to the number of provided redundant elements. The result of the application of the steps of FIG. 10 to these defective elements are also shown in FIG. 13.

In accordance to one aspect of the invention, there is provided a highly elegant technique for assigning the defective elements to the fuse-sharing redundant elements after the defective elements have been grouped for fuse saving. In one embodiment, after each group of defective elements are done processing (e.g., after the size of the group found to be less than 3 and fails the test of step 1004 of FIG. 10), each defective element starting with the first defective element of the group is simply assigned a sequentially increasing tag number. In a nonobvious manner, the assigned tag number identifies the redundant element to which a particular defective element is identified.

To illustrate this aspect, consider the example of FIG. 11. After the group consisting of defective elements D1, D2, and D3 is processed in the first iteration, two groups result: a first group consisting of defective elements D1 and D2 and a second group consisting of defective elements D3. After the second iteration, fuse F2 of the first group is deemed shared. Going into the third iteration, the group consisting of defective elements D1 and D2 will fail the test of step 1004 since the size of this group is less than 3. According to the inventive assignment technique, defective element D1 will be assigned to tag T1 and defective element D2 will be assigned to the next sequentially increasing tag number, i.e., T2.

Since processing is finished for the group consisting of defective elements D1 and D2, the method next processes the group consisting of defective element D3. However, this group will also fail the test of step 1004 since the size of this group is less than 3. According to the inventive assignment technique, defective element D3 of this group will be assigned to the next sequentially increasing tag number, i.e., T3.

Since processing is finished for the group consisting of defective elements D1, D2, and D3 are finished, the method next processes the group consisting of defective element D4, D5, and D6. After the group consisting of defective elements D4, D5, and D6 is processed in the first iteration, two groups result: a first group consisting of defective elements D4 and D6 and a second group consisting of defective elements D5. After the second iteration, fuse F2 of the first group is deemed shared (D4/D6). Going into the third iteration, the group consisting of defective elements D4 and D6 will fail the test of step 1004 since the size of this group is less than 3. According to the inventive assignment technique, defective element D4 will be assigned the next sequentially increasing tag number (i.e., T4) and defective element D6 will be assigned to the next sequentially increasing (tag number, i.e., T5.

Since processing is finished for the group consisting of defective elements D4 and D6, the method next processes the group consisting of defective element D5. However, this group will also fail the test of step 1004 since the size of this group is less than 3. According to the inventive assignment technique, defective element D5 of this group will be assigned to the next sequentially increasing tag number, i.e., T6.

After processing is finished for all the groups, the assigned tag numbers are employed to match up each defective element with its corresponding redundant element. With reference to FIG. 5, defective element D1, which is assigned to T1, will be matched up to R1 (the array of redundant elements is already labeled R1–R6 as shown in FIG. 5). Dummy defective element D2, which is assigned to T2, will be matched up to R2. However, no assignment is necessary since defective element D2 is a dummy defective element only. Alternative, if it is assigned, the enable fuse associated with redundant element R2 is not set so that redundant element R2 will not be used.

Defective element D3, which is assigned to T3, will be matched up to R3. Defective element D4, which is assigned to T4, will be matched up to R4. Defective element D6, which is assigned to T5, will be matched up to R5. Defective element D5, which is assigned to T6, will be matched up to R6.

The assignment of the defective elements of the example of FIG. 12 to the defective fuses is shown in FIG. 12 (the tags are shown on the right hand side of the defective elements under column heading "Second Iteration."). The result of the matching will be D1/R1, D4/R2, D2/R3, D3/R4, D6/R5, and D5/R6 (with redundant elements R2, R5, and R6 either not assigned or having their enable fuses not set).

The assignment of the defective elements to the redundant fuses of the example of FIG. 13 is also shown in FIG. 13 (the tags are shown on the right hand side of the defective elements under column heading "Second Iteration."). The result of the matching will be D1/R1, D2/R2, D3/R3, D5/R4, D6/R5, and D4/R6. Since six defective elements are found, all redundant elements are employed (i.e., there are no dummy defective elements).

As can be appreciated from the foregoing, the invention provides techniques wherein any arbitrary group of redundant elements having any arbitrary size greater than 2 can be grouped for the purpose of sharing fuses. It is contemplated that the fabrication-time application of the inventive saving technique, as well as the replacement-time application thereof, may be implemented as computer-implemented processes in accordance to the steps outlined in FIGS. 8 and 10. The implementation of the methods disclosed herein as computer program instructions is well within the skills of those skilled in the art of programming in view of this disclosure.

It is found that a significant number of fuses can be shared for a given group of redundant elements, leading to the reduction in the required number of address fuses and the concomitant in the area required to implement the DRAM circuit. The area saving is even more dramatic when one takes into consideration the concomitant reduction in the number of address latches (since only one shared address latch is required per shared fuse) and in the wirings to/from the saved latches and/or fuses. The saved area may be employed to, for example, increase the capacity of the DRAM circuit.

The following table illustrates the saving that may be realized for some exemplary groups of redundant elements. In Table 1, it is assumed for illustration purposes that the main array has $2^{10}$ elements and 10 address bits are required to uniquely address each main array element (i.e., 10 fuses, whether shared or not, are required per redundant element). The saving percentages are calculated on the basis of 10 address fuses as well as on the basis of 10 address fuses and 1 enable fuse per redundant element (for a total of 11 fuses per redundant element). It is expected that the saving percentage advantageously increases as DRAM capacity increases and more redundant elements, as well as more address fuses per redundant element, are required.

While this invention has been described in terms of several illustrative embodiments, there are alterations, permutations, and equivalents which fall within the scope of this invention. By way of example, although the disclosures refers mainly to fuses, the term fuse may also encompass anti-fuses. Also, although the described embodiment includes the use of address and enable latches, the inventive fuse saving techniques, being applicable to fuses, may also be employed in DRAMs wherein no such latches are provided. It is therefore intended that the following appended claims be interpreted as including all such alterations, permutations, and equivalents as fall within the true spirit and scope of the present invention.

What is claimed is:

1. A method for reducing address fuses employed for implementing a first plurality of redundant elements in a memory array, said method comprising:

ascertaining whether a number of redundant elements in said first plurality of redundant elements is at least three; and if said number of redundant elements in said first plurality of redundant elements is at least three, optimizing said address fuses by:

forming a first group of redundant elements from said first plurality of redundant elements, forming a second group of redundant elements from said first plurality of redundant elements, said second group of redundant elements being mutually exclusive with respect to said first group of redundant elements, and providing a first fuse to be shared among redundant elements of said first group of redundant elements, said first fuse implementing a highest order address fuse of said redundant elements of said first group of redundant elements.

2. The method of claim 1 wherein said memory array represents an array of a dynamic random access memory circuit.

3. The method of claim 1 wherein said first group of redundant elements consists of INT (M/2) redundant elements and wherein M represents said number of redundant elements in said first plurality of redundant elements, remaining redundant elements of said first plurality of redundant elements belong to said second group of redundant elements.

TABLE 1

| # REDUNDANT ELEMENTS | M = 4 | M = 8 | M = 16 | M = 32 | M = 64 | M = 128 |
|---|---|---|---|---|---|---|
| # OF FUSES SAVED | 1 | 5 | 17 | 49 | 129 | 321 |
| TOTAL NUMBER OF ADDRESS FUSES (FOR 10 ADDRESS FUSES PER REDUNDANT ELEMENT) | 40 | 80 | 160 | 320 | 640 | 1280 |
| % SAVINGS | 2.5 | 6.25 | 10.625 | 15.3 | 20.15 | 25.1 |
| TOTAL NUMBER OF ADDRESS FUSES AND ENABLE FUSES (FOR 10 ADDRESS FUSES AND 1 ENABLE FUSE PER REDUNDANT ELEMENT) | 44 | 88 | 176 | 352 | 704 | 1408 |
| % SAVINGS | .2 | 5.7 | 9.65 | 13.9 | 18.32 | 22.8 |

4. The method of claim 3 wherein said optimizing further comprises:

if a number of redundant elements in said second group of redundant elements is at least three, further optimizing said address fuses by:

forming a third group of redundant elements from said second group of redundant elements, forming a fourth group of redundant elements from said second group of redundant elements, said fourth group of redundant elements being mutually exclusive with respect to said third group of redundant elements, and providing a second fuse to be shared among redundant elements of said third group of redundant elements, said second fuse implementing a next-to-highest order address fuse of said redundant elements of said third group of redundant elements.

5. The method of claim 4 wherein said third group of redundant elements consists of INT (N/2) redundant elements and wherein N represents a number of redundant elements in said second group of redundant elements, remaining redundant elements of said second group of redundant elements belong to said fourth group of redundant elements.

6. In a computer having a processor, a computer-implemented method for reducing address fuses employed for implementing a first plurality of redundant elements in a memory array, said computer-implemented method comprising:

ascertaining whether a number of redundant elements in said first plurality of redundant elements is at least three, and if said number of redundant elements in said first plurality of redundant elements is at least three, optimizing said address fuses by:

forming, using said processor, a first group of redundant elements from said first plurality of redundant elements, forming, using said processor, a second group of redundant elements from said first plurality of redundant elements, said second group of redundant elements being mutually exclusive with respect to said first group of redundant elements, and designating, using said processor, a first fuse to be shared among redundant elements of said first group of redundant elements, said first fuse implementing a highest order address fuse of said redundant elements of said first group of redundant elements.

7. The computer-implemented method of claim 6 wherein said first group of redundant elements consists of INT (M/2) redundant elements and wherein M represents said number of redundant elements in said first plurality of redundant elements, remaining redundant elements of said first plurality of redundant elements belong to said second group of redundant elements.

8. The computer-implemented method of claim 7 wherein said optimizing further comprises:

if a number of redundant elements in said second group of redundant elements is at least three, further optimizing said address fuses by:

forming, using said processor, a third group of redundant elements from said second group of redundant elements, forming, using said processor, a fourth group of redundant elements from said second group of redundant elements, said fourth group of redundant elements being mutually exclusive with respect to said third group of redundant elements, and designating, using said processor, a second fuse to be shared among redundant elements of said third group of redundant elements, said second fuse implementing a next-to-highest order address fuse of said redundant elements of said third group of redundant elements.

9. The computer-implemented method of claim 8 wherein said third group of redundant elements consists of INT (N/2) redundant elements and wherein N represents a number of redundant elements in said second group of redundant elements, remaining redundant elements of said second group of redundant elements belong to said fourth group of redundant elements.

10. A memory array having a first plurality of fuse-sharing redundant elements for replacing defective elements of said memory array, comprising:

a first fuse;

a first group of redundant elements of said first plurality of fuse-sharing redundant elements, said first group of redundant elements sharing said first fuse as their highest order address fuse; and a second group of redundant elements of said first plurality of fuse-sharing redundant elements, said second group of redundant elements being mutually exclusive with respect to said first group of redundant elements.

11. The memory array of claim 10 wherein said memory array represents an array of a dynamic random access memory circuit.

12. The memory array of claim 10 wherein said first group of redundant elements consists of INT (M/2) redundant elements and wherein M represents said number of redundant elements in said first plurality of fuse-sharing redundant elements, remaining redundant elements of said first plurality of fuse-sharing redundant elements belong to said second group of redundant elements.

13. The memory array of claim 12 further comprising a second fuse and wherein said second group of redundant element comprises:

a third group of redundant elements, said third group of redundant elements sharing said second fuse as their next-to-highest order address fuse; and a fourth group of redundant elements, said fourth group of redundant elements being mutually exclusive with respect to said third group of redundant elements.

14. The memory array of claim 13 wherein said third group of redundant elements consists of INT (N/2) redundant elements and wherein N represents a number of redundant elements in said second group of redundant elements, remaining redundant elements of said second group of redundant elements belong to said fourth group of redundant elements.

15. In a computer, a computer-implemented method for replacing a first plurality of defective elements of a memory array with redundant elements of a first plurality of fuse-sharing redundant elements, comprising:

ascertaining whether a number of defective elements of said first plurality of defective elements is less than a number of redundant elements of said first plurality of fuse-sharing redundant elements;

if said number of defective elements of said first plurality of defective elements is less than said number of redundant elements of said first plurality of fuse-sharing redundant elements, adding a plurality of dummy defective elements to said first plurality of defective elements to increase a number of defective elements of said first plurality of defective elements to said number of redundant elements of said first plurality of fuse-sharing redundant elements;

ascertaining whether said number of defective elements of said first plurality of defective elements is at least three; and if said number of defective elements of said first plurality of defective elements is at least three, replacing respective ones of said first plurality of defective elements by respective ones of said first plurality of redundant elements by performing the steps of:

forming a first group of defective elements from said first plurality of defective elements, defective elements in said first group of defective elements sharing a same bit value at a highest order address bit position, forming a second group of defective elements from said first plurality of defective elements, said second group of defective elements being mutually exclusive with respect to said first group of defective elements, and assigning respective ones of said first group of defective elements to respective ones of said first group of redundant elements for replacement.

16. The computer-implemented method of claim 15 wherein said first group of defective elements consists of INT (P/2) defective elements and wherein P represents a number of redundant elements in said first plurality of defective elements, remaining defective elements of said first plurality of defective elements belong to said second group of defective elements.

17. The computer-implemented method of claim 16 wherein said replacing further comprises:

if a number of defective elements in said second group of defective elements is at least three, further performing the steps of:

forming a third group of defective elements from said second group of defective elements, defective elements in said third group of defective elements sharing a same bit value at a next-to-highest order address bit position, forming a fourth group of defective elements from said second group of defective elements, said fourth group of defective elements being mutually exclusive with respect to said third group of defective elements, and assigning respective ones of said third group of defective elements to respective ones of said first group of redundant elements for replacement.

18. The computer-implemented method of claim 17 wherein said third group of defective element consists of INT (Q/2) redundant elements and wherein Q represents a number of defective elements in said second group of defective elements, remaining redundant elements of said second group of defective elements belong to said fourth group of defective elements.

19. The computer-implemented method of claim 15 wherein said memory array represents an array of a dynamic random access memory circuit.

20. A method for replacing a first plurality of defective elements of a memory array with redundant elements of a first plurality of fuse-sharing redundant elements, comprising:

ascertaining whether a number of defective elements of said first plurality of defective elements is less than a number of redundant elements of said first plurality of fuse-sharing redundant elements;

if said number of defective elements of said first plurality of defective elements is less than said number of redundant elements of said first plurality of fuse-sharing redundant elements, adding a plurality of dummy defective elements to said first plurality of defective elements to increase a number of defective elements of said first plurality of defective elements to said number of redundant elements of said first plurality of fuse-sharing redundant elements;

ascertaining whether said number of defective elements of a first plurality of defective elements found in said memory array is at least three; and if said number of defective elements of said first plurality of defective elements is at least three, replacing respective ones of said first plurality of defective elements by respective ones of said first plurality of redundant elements by performing the steps of:

forming a first group of defective elements from said first plurality of defective elements, defective elements in said first group of defective elements sharing a same bit value at a highest order address bit position, forming a second group of defective elements from said first plurality of defective elements, said second group of defective elements being mutually exclusive with respect to said first group of defective elements, and assigning respective ones of said first group of defective elements to respective ones of said first group of redundant elements for replacement.

21. The method of claim 20 wherein said first group of defective elements consists of INT (P/2) defective elements and wherein P represents a number of redundant elements in said first plurality of defective elements, remaining defective elements of said first plurality of defective elements belong to said second group of defective elements.

22. The method of claim 21 wherein said replacing further comprises:

if a number of defective elements in said second group of defective elements is at least three, further performing the steps of:

forming a third group of defective elements from said second group of defective elements, defective elements in said third group of defective elements sharing a same bit value at a next-to-highest order address bit position, forming a fourth group of defective elements from said second group of defective elements, said fourth group of defective elements being mutually exclusive with respect to said third group of defective elements, and assigning respective ones of said third group of defective elements to respective ones of said first group of redundant elements for replacement.

23. The method of claim 22 wherein said third group of defective element consists of INT (Q/2) redundant elements and wherein Q represents a number of defective elements in said second group of defective elements, remaining redundant elements of said second group of defective elements belong to said fourth group of defective elements.

24. The method of claim 20 wherein said memory array represents an array of a dynamic random access memory circuit.

* * * * *